United States Patent
Sehgal et al.

(10) Patent No.: US 10,706,936 B1
(45) Date of Patent: Jul. 7, 2020

(54) SYSTEM AND METHOD FOR AVOIDING BACK TO BACK PROGRAM FAILURE

(71) Applicant: Western Digital Technologies, Inc., San Jose, CA (US)

(72) Inventors: Rohit Sehgal, San Jose, CA (US); Grishma Shah, Milpitas, CA (US); Sahil Sharma, San Jose, CA (US); Phil Reusswig, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/418,319

(22) Filed: May 21, 2019

Related U.S. Application Data (60) Provisional application No. 62/839,115, filed on Apr. 26, 2019.

(51) Int. Cl.
| | |
|---|---|
| *G11C 7/00* | (2006.01) |
| *G11C 16/10* | (2006.01) |
| *G11C 16/08* | (2006.01) |
| *G06F 3/06* | (2006.01) |
| *G11C 16/04* | (2006.01) |

(52) U.S. Cl.
CPC .............. *G11C 16/10* (2013.01); *G06F 3/064* (2013.01); *G06F 3/0604* (2013.01); *G06F 3/0659* (2013.01); *G06F 3/0679* (2013.01); *G11C 16/08* (2013.01); *G11C 16/0483* (2013.01)

(58) Field of Classification Search
CPC ....... G11C 7/1078; G11C 7/22; G11C 7/1006; G11C 7/1072; G11C 7/1096
USPC .................................................... 365/189.16
See application file for complete search history.

(56) References Cited

U.S. PATENT DOCUMENTS

| | | | |
|---|---|---|---|
| 6,710,399 B2 | 3/2004 | Kamei | |
| 7,054,195 B2 | 5/2006 | Matsunaga | |
| 7,292,475 B2 | 11/2007 | Kodaira et al. | |
| 7,817,481 B2 * | 10/2010 | Adams .................. | G11C 11/419 365/154 |

(Continued)

FOREIGN PATENT DOCUMENTS

CN      108053857 A     5/2018

*Primary Examiner* — Son T Dinh
(74) *Attorney, Agent, or Firm* — Morgan, Lewis & Bockius LLP (57) ABSTRACT

In one embodiment, there is a system comprising a first group of blocks connected to a first address line, a second group of blocks connected to a second address line separate and distinct from the first address line, a host controller (or memory device) configured to: allocate a single open block to each of: the first group of blocks connected to the first address line that transmits an address signal generated by a first peripheral circuitry module, and the second group of blocks connected to the second address line that transmits an address signal generated by a second peripheral circuitry module; in response to receiving a first program request: program the open block in the first group of blocks connected to the first address line in response to a first program request in response to receiving a second program request separate and distinct from the first program request: forego programming any of the blocks in the first group of blocks connected to the first address line; and program one of the blocks in the second group of blocks connected to the second address line.

15 Claims, 5 Drawing Sheets

(56) References Cited

U.S. PATENT DOCUMENTS 8,441,853 B2   5/2013   Li
10,055,267 B2   8/2018   Agarwal et al.

* cited by examiner

402: Allocate a single open block to each of: the first group of blocks connected to the first address line generated by a first peripheral circuitry module, and the second group of blocks connected to the second address line generated by a second peripheral circuitry module

404: In response to receiving a first program request: program the open block in the first group of blocks connected to the first address line in response to a first program request

406: In response to receiving a second program request separate and distinct from the first program request: forego programming any of the blocks in the first group of blocks connected to the first address line; and program one of the blocks in the second group of blocks connected to the second address line.

Figure 4

SYSTEM AND METHOD FOR AVOIDING BACK TO BACK PROGRAM FAILURE

CROSS-REFERENCE TO RELATED APPLICATIONS

This application claims the benefit of U.S. Provisional Patent Application No. 62/839,115 filed Apr. 26, 2019 entitled "SYSTEM AND METHOD FOR AVOIDING BACK TO BACK PROGRAM FAILURE", incorporated by reference herein in its entirety.

BACKGROUND

Semiconductor memory devices or solid-state drives (SSD), typically utilize memory cells to store data as an electrical value, such as an electrical charge or voltage. A memory cell, for example, includes a single transistor with a floating gate that may be used to store a charge representative of a data value. The memory may be non-volatile memory where the memory may retain stored information even without power, as opposed to volatile memory, which requires power to maintain the stored information. The memory may be electrically erased and reprogrammed using a controller and peripheral circuitry associated with the memory. In some instances, the peripheral circuitry may contain a defect that causes successive or back-to-back programming errors (as explained herein) for certain portions of memory when being written to. Thus, there is a need for an efficient semiconductor device and controller thereof that optimizes use of all blocks in the memory to avoid back to back program failure.

SUMMARY

Without limiting the scope of the appended claims, after considering this disclosure, and particularly after considering the section entitled "Detailed Description," one will understand how the aspects of various embodiments are implemented and used to avoid back to back program failure using system level block selection methodology.

In one embodiment, there is a system comprising a first group of blocks connected to a first address line, a second group of blocks connected to a second address line separate and distinct from the first address line, a host controller (or memory device) configured to: allocate a single open block to each of: the first group of blocks connected to the first address line that transmits an address signal generated by a first peripheral circuitry module, and the second group of blocks connected to the second address line that transmits an address signal generated by a second peripheral circuitry module; in response to receiving a first program request: program the open block in the first group of blocks connected to the first address line in response to a first program request in response to receiving a second program request separate and distinct from the first program request: forego programming any of the blocks in the first group of blocks connected to the first address line; and program one of the blocks in the second group of blocks connected to the second address line.

In one embodiment, the programming one of the blocks in the second group of blocks includes programming the open block in the second group of blocks.

In one embodiment, the host controller (or memory device) is further configured to: after programming the open block in the second group of blocks connected to the second address: in response to receiving a third program request separate and distinct form the first program request and the second program request: forego programming any of the blocks in the second group of blocks connected to the second address line; and program another block other than the blocks in the second group of blocks connected to the second address line.

In one embodiment, an open block is configured to be partially programmed such that only a first portion of wordlines are programmed while a second portion of wordlines are not programmed.

In one embodiment, the first address line is a control gate line.

In one embodiment, the first peripheral circuitry module includes at least one of: a first control gate and a first decoder, wherein the second peripheral circuitry module includes at least one of: a second control gate and a second decoder, in some embodiments, separate and distinct from the first control gate and the first decoder, respectively.

In one embodiment, programming the open block in the first group of blocks includes writing data to at least some, but not all, of the word lines of the open block.

In one embodiment, there is a method for minimizing back-to-back program failures at a storage system including a first group of blocks connected to a first address line, a second group of blocks connected to a second address line separate and distinct from the first address line, and a memory device configured to perform the steps of: allocating a single open block to each of: the first group of blocks connected to the first address line that transmits an address signal generated by a first peripheral circuitry module, and the second group of blocks connected to the second address line that transmits an address signal generated by a second peripheral circuitry module; in response to receiving a first program request: programming the open block in the first group of blocks connected to the first address line in response to a first program request in response to receiving a second program request separate and distinct from the first program request: forego programming any of the blocks in the first group of blocks connected to the first address line; and programming one of the blocks in the second group of blocks connected to the second address line.

In one embodiment, programming one of the blocks in the second group of blocks includes programming the open block in the second group of blocks.

In one embodiment, the host controller (or memory device) is further configured to perform the steps of: after programming the open block in the second group of blocks connected to the second address: in response to receiving a third program request separate and distinct form the first program request and the second program request: forego programming any of the blocks in the second group of blocks connected to the second address line; and program another block other than the blocks in the second group of blocks connected to the second address line.

In one embodiment, an open block is configured to be partially programmed such that only a first portion of wordlines are programmed while a second portion of wordlines are not programmed.

In one embodiment, the first address line is a control gate line.

In one embodiment, the first peripheral circuitry module includes at least one of: a first control gate and a first decoder, and the second peripheral circuitry module includes at least one of: a second control gate and a second decoder, in some embodiments, separate and distinct from the first control gate and the first decoder, respectively.

In one embodiment, programming the open block in the first group of blocks includes writing data to at least some, but not all, of the word lines of the open block.

In one embodiment, there is a storage system including a first group of blocks connected to a first address line, a second group of blocks connected to a second address line separate and distinct from the first address line, and a host controller (or memory device) comprising: means for allocating a single open block to each of: the first group of blocks connected to the first address line that transmits an address signal generated by a first peripheral circuitry module, and the second group of blocks connected to the second address line that transmits an address signal generated by a second peripheral circuitry module; in response to receiving a first program request: means for programming the open block in the first group of blocks connected to the first address line in response to a first program request in response to receiving a second program request separate and distinct from the first program request: means for foregoing programming of any of the blocks in the first group of blocks connected to the first address line; and means for programming one of the blocks in the second group of blocks connected to the second address line.

BRIEF DESCRIPTION OF THE SEVERAL VIEWS OF THE DRAWINGS

The foregoing summary, as well as the following detailed description of embodiments of the disclosed invention, will be better understood when read in conjunction with the appended drawings of an exemplary embodiment. It should be understood, however, that the invention is not limited to the precise arrangements and instrumentalities shown.
In the drawings.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure pertinent aspects of the embodiments described herein.

Figure 1:
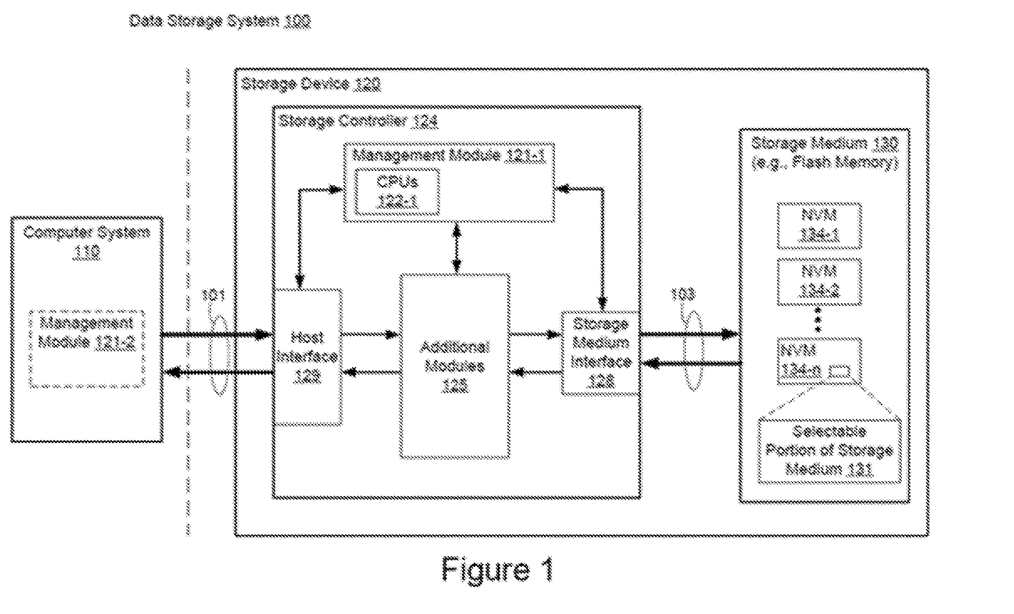
FIG. 1 is a schematic block diagram illustrating an implementation of a data storage system, in accordance with some embodiments.

Referring to FIG. 1, there is shown a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120 (also sometimes called an information storage device, or a data storage device, or a memory device), which includes a storage controller 124 and a storage medium 130, and is used in conjunction with or includes a computer system 110 (e.g., a host system or a host computer). In some embodiments, storage medium 130 is a single flash memory device while in other embodiments storage medium 130 includes a plurality of flash memory devices. In some embodiments, storage medium 130 is NAND-type flash memory or NOR-type flash memory. In some embodiments, storage medium 130 includes one or more three-dimensional (3D) memory devices. In some embodiments, the memory cells of storage medium 130 are configured to store two or three bits per memory cell. Further, in some embodiments, storage controller 124 is a solid-state drive (SSD) controller. However, other types of storage media may be included in accordance with aspects of a wide variety of embodiments (e.g., Phase Change Random-Access Memory (PCRAM), Resistive Random Access Memory (ReRAM), Spin-Transfer Torque Random-Access Memory (STT-RAM), Magnetoresistive Random-Access Memory (MRAM), etc.). In some embodiments, a flash memory device includes one or more flash memory die, one or more flash memory packages, one or more flash memory channels or the like. In some embodiments, data storage system 100 includes one or more storage devices 120.

Computer system 110 is coupled to storage controller 124 through data connections 101. However, in some embodiments computer system 110 includes storage controller 124, or a portion of storage controller 124, as a component and/or as a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch-screen display, a mouse, a track-pad, a digital camera, and/or any number of supplemental I/O devices to add functionality to computer system 110. In some embodiments, computer system 110 does not have a display and other user interface components.

Storage medium 130 is coupled to storage controller 124 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 124 and storage medium 130 are included in the same device (i.e., an integrated device) as components thereof. Furthermore, in some embodiments, storage controller 124 and storage medium 130 are embedded in a host device (e.g., computer system 110), such as a mobile device, tablet, other computer or computer controlled device, and the methods described herein are performed, at least in part, by the embedded storage controller. Storage medium 130 may include any number (i.e., one or more) of memory devices 134-*i* including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally, and/or alternatively, flash memory device(s) can also be configured for relatively smaller-scale applications such as personal flash drives or hard-disk replacements for personal, laptop, and tablet computers. In some embodiments, each memory device 134-*i* is a single 3D persistent memory or non-volatile semiconductor memory die.

Memory devices 134-*i* of storage medium 130 may include addressable and individually selectable blocks (e.g., blocks 302, shown in FIGS. 3A-3D), such as selectable portion 131 of storage medium 130 (also referred to herein as selected portion 131). In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the flash memory device.

In some embodiments, storage controller 124 includes a management module 121-1, a host interface 129, a storage medium interface 128, and additional module(s) 125. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Host interface 129 typically includes an input buffer and output buffer, not shown. Similarly, storage medium Interface 128 provides an interface to storage medium 130 though connections 103. In some embodiments, storage medium Interface 128 includes read and write circuitry, including circuitry capable of providing reading signals to storage medium 130 (e.g., reading threshold voltages for NAND-type flash memory).

In some embodiments, management module 121-1 includes one or more processing units 122-1 (sometimes herein called CPUs, processors, or hardware processors, and sometimes implemented using microprocessors, microcontrollers, or the like) configured to execute instructions in one or more programs (e.g., in management module 121-1). In some embodiments, the one or more CPUs 122-1 are shared by one or more components within, and in some cases, beyond the function of storage controller 124. Management module 121-1 is coupled to host interface 129, additional module(s) 125 and storage medium Interface 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

In some embodiments, additional module(s) 125 include an error control module, provided to limit the number of uncorrectable errors inadvertently introduced into data during writes to memory or reads from memory. In some embodiments, the error control module is executed in software by the one or more CPUs 122-1 of management module 121-1, and, in other embodiments, the error control module is implemented in whole or in part using special purpose circuitry to perform data encoding and decoding functions. To that end, in some embodiments, the error control module includes an encoder and a decoder. The encoder encodes data by applying an error control code to produce a codeword, which is subsequently stored in storage medium 130.

When the encoded data (e.g., one or more codewords) is read from storage medium 130, the decoder applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

The storage controller 124 is configured to perform programming operations (e.g., read/write/erase operations). For example, a read operation is initiated when computer system (host) 110 sends one or more host read commands (e.g., via data connections 101) to storage controller 124 requesting data from one or more block pools of storage medium 130. Storage controller 124 sends one or more read access commands to storage medium 130, via storage medium interface 128, to obtain raw read data in accordance with memory locations (addresses at specific pools) specified by the one or more host read commands. Storage medium interface 128 provides the raw read data (e.g., comprising one or more codewords) to the decoder. If the decoding is successful, the decoded data is provided to an output buffer, where the decoded data is made available to computer system 110. In some embodiments, if the decoding is not successful, storage controller 120 may resort to a number of remedial actions or provide an indication of an irresolvable error condition. Similar operations are performed for write operations and erase operations, except for write operations, data is written to the memory locations and for erase operations, data is erased form the memory locations.

Figure 2:
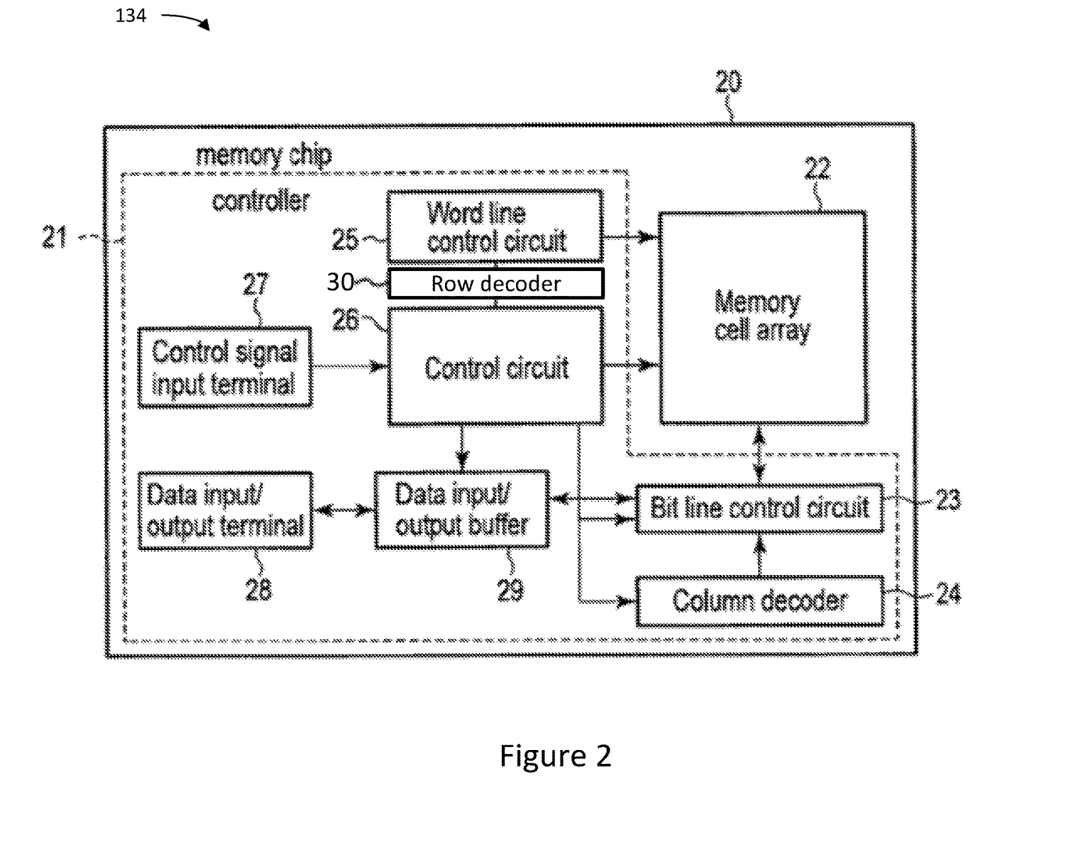
FIG. 2 is a is a schematic block diagram of a re-programmable non-volatile memory system which utilizes the memory cell array of FIG. 1, and which indicates connection of the memory system with a host system.

FIG. 2 is a block diagram illustrating a configuration of an exemplary memory device 134. The memory device 134 includes at least a memory chip 20. FIG. 3 is a block diagram illustrating a configuration of the memory chip 20.

Memory cells in each of which the data can electrically be rewritten are two-dimensionally arrayed in memory cell array 22. As described above, the memory cells may be grouped into blocks. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. Plural bit lines, plural word lines, and a common source line are provided in the memory cell array 22. The memory cell is disposed in an intersection area of the bit line and the word line.

A word line control circuit 25 that is of a row decoder is connected to the plural word lines to select and drive the word line in reading, writing, and erasing the data. A bit line control circuit 23 is connected to the plural bit lines to control the voltage at the bit line in reading, writing, and erasing the data. The bit line control circuit 23 senses the data of the bit line during the data read, and applies the voltage corresponding to the write data to the bit line during the data write. According to an address, a column decoder 24 generates a column select signal in order to select the bit line, and transmits the column select signal to the bit line control circuit 23. Also, according to an address, a row decoder 30 generates a row select signal in order to select the word line, and transmits the row select signal to the word line control circuit 30.

The read data read from the memory cell array 22 is externally output from a data input/output terminal 28 through the bit line control circuit 23 and a data input/output buffer 29. The write data input to the data input/output terminal 28 from the outside is input to the bit line control circuit 23 through the data input/output buffer 29.

The memory cell array 22, the bit line control circuit 23, the column decoder 24, the row decoder 30, the data input/output buffer 29, and the word line control circuit 25 are connected to a control circuit 26. Based on the control signal input to a control signal input terminal 27 from the outside, the control circuit 26 generates a control signal (also referred to herein as an address signal) and a control voltage in order to control one or more blocks of the memory cell array 22. The control circuit 26 may also generate peripheral control signals to control the bit line control circuit 23, the column decoder 24, the row decoder 30, the data input/output buffer 29, and the word line control circuit 25. In the memory chip 20, the units except the memory cell array 22 are collectively referred to as a memory cell array peripheral control unit 21.

In some embodiments, the blocks may be organized into groups where each block group is electrically connected to an address signal line and is configured to receive a dedicated address signal from the control circuit 26. In one embodiment, a block group includes 16 blocks. However, in some embodiments, the block group may include any number of blocks suitable for memory devices.

Figure 3A:
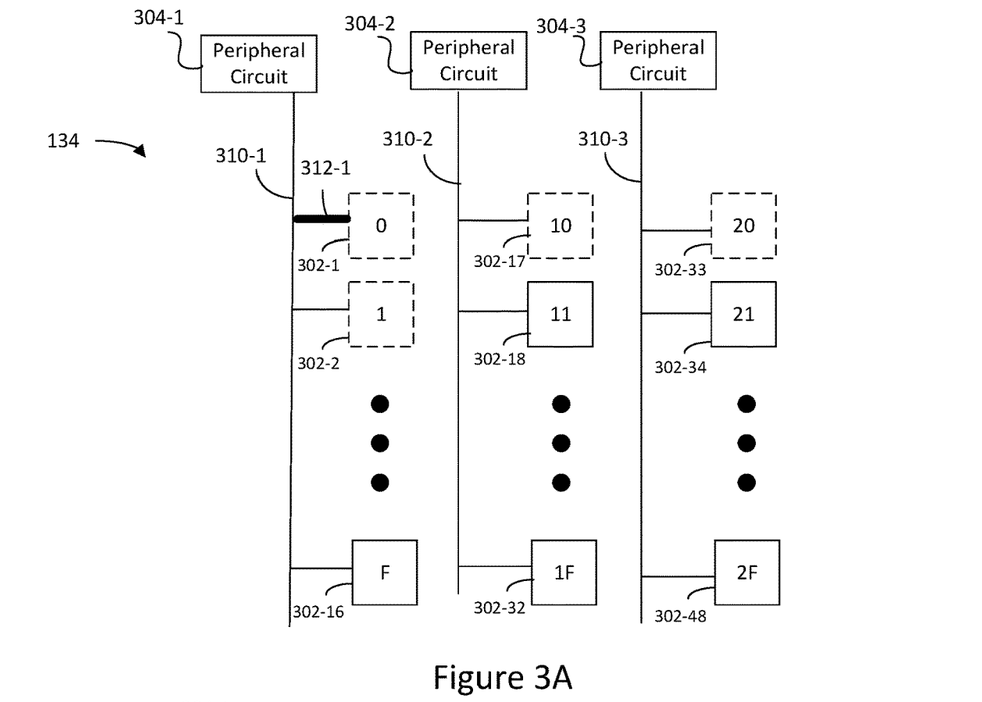
FIGS. 3A-3B is a conceptual block diagram illustrating a sequence for programming one or more blocks of memory device 134 of FIGS. 1-2 that results in back-to-back programming errors for the memory device 134.
Figure 3B:
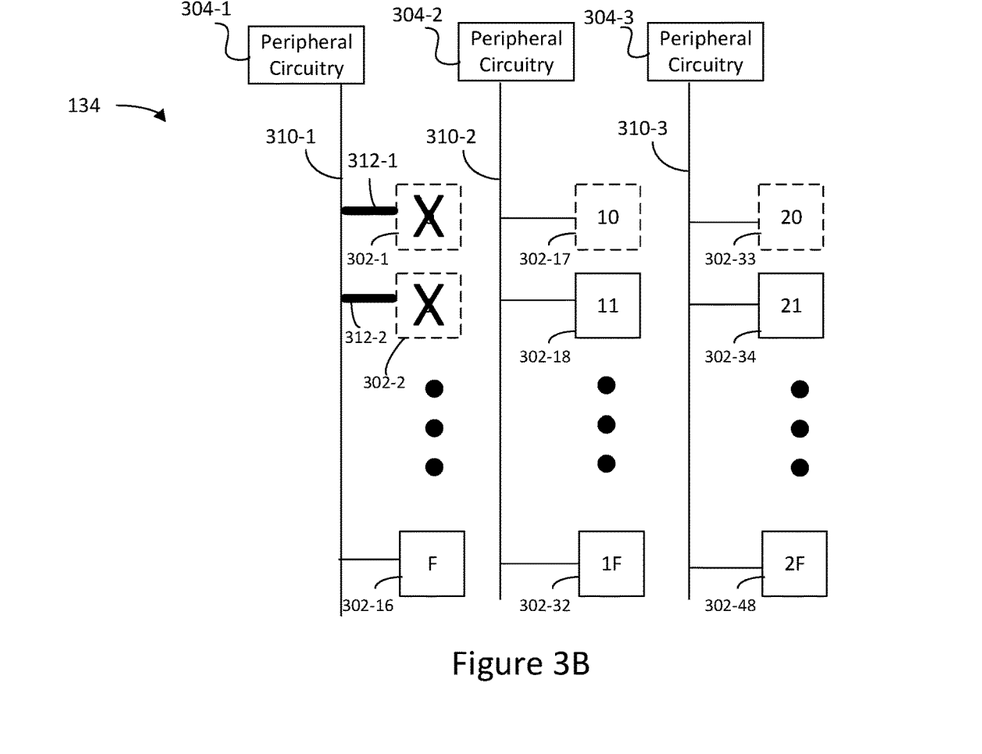

Turning to FIGS. 3A-3B, there is shown a conceptual block diagram illustrating a process for programming one or more blocks of memory device 134 of FIGS. 1-2 that results in back-to-back programming errors for the memory device 134, in accordance with some embodiments. While some example features are illustrated, various other features have not been illustrated for the sake of brevity and so as not to obscure pertinent aspects of the example embodiments disclosed herein. For example, peripheral circuit 304-*i* represents one or more components of memory cell array peripheral control unit 21 of FIG. 2. In another example, blocks 302 are shown instead of memory cell array 22 in FIG. 2. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block.

An address line 310-*i* extends from each respective peripheral circuit 304-*i*. For ease of understanding, the address lines 310 are shown as individual lines. However, in some embodiments, each address line 310-*i* may include multiple lines including control gate lines, decoder lines, word lines and bit lines, some of which are shown in FIG. 2. In FIGS. 3A-3B, three peripheral circuits 304 and three address lines 310 are shown for ease of understanding. However, it is contemplated that, in some embodiments, memory device 134 may include any number of respective peripheral circuits and address lines suitable for memory devices.

Blocks 302 are connected to a respective address line 310. For example, blocks 302-1 to 302-16 are connected to address line 310-1, blocks 302-17 to 302-32 are connected to address line 310-2, and blocks 302-33 to 302-48 are connected to address line 310-3. Similar to the peripheral circuitry 304 and the address line 310, while sixteen blocks 302 are shown as connected to a respective address line 310, in some embodiments, memory device 134 may include any number of blocks connected to the respective address line 310 suitable for memory devices.

Now, the back-to-back program failure scenario will be explained. In one example, upon receiving a first program request, a peripheral circuit 304-*i* may program one of the blocks 302 connected to the respective peripheral circuit. To program one of the blocks 302 in a block group, a peripheral circuit 304-*i* transmits an address signal to the respective block 302-*i* via address line 310. For example, as shown in FIG. 3A, peripheral circuit 304-1 has transmitted an address signal via address line 310-1 that causes block 302-1, labeled as block "0" to be selected for programming. The bolded selection line 312-1 between block 302-1 and address line 310-1 indicates that block 302-1 is being programmed.

In this example, block 302-1 is an open block. As used herein, an open block is a block configured to be partially programmed such that only a first portion of wordlines of the block are programmed while a second portion of wordlines of the block are not programmed. For example, if block 302-1 has ninety-five word lines, twenty-five word lines might be programmed during a single programming operation, leaving the other seventy word lines unprogrammed. As used herein, a closed block is a block where all of the wordlines are programmed during a single programming operation. In FIGS. 3A-3B, an open block 302-*i* is represented as a box having a dotted line border.

Upon receiving a second program request, as shown in FIG. 3B, a peripheral circuit 304-*i* may select another of the blocks 302 (e.g., open block 302-2) connected to the respective peripheral circuit and part of the same group as the first programmed block (e.g., block 302-1) for programming. The bolded selection line 312-2 between block 302-2 and address line 310-1 indicates that block 302-2 is being programmed. However, a peripheral defect might exist for the memory device 134 which causes open block 302-1 to remain selected for an amount of time even after the previous programming operation has completed. Examples of peripheral (periphery) defects may include a contact void (weak pump), a peripheral logic circuit issue, a charge pump issue, a block selection (BLKSEL) to local interconnection (Li) leak. As a result, a program failure may occur on the memory device 134 because both block 302-1 and block 302-2 are selected as shown at bolded selection lines 312-1 and 312-2. The program failure is represented by the "X" over the respective blocks 302-1 and 302-2 that experienced the program failure. As used herein, a program failure may be any programming operation that does not result in successful access to a selected block. When multiple blocks are selected on the same address line, as shown in FIG. 3B with blocks 302-1 and 302-2 and address line 310-1, a program failure occurs because there is not enough current (to drive both the selected blocks) being provided by the peripheral circuit 304-1, nor is the programming voltage (Vpgm) sufficient to maintain both blocks 302-1 and 302-2 in a state to be programmed. Thus, block 302-2 cannot be programmed.

Memory device 134 may attempt to write to another block to perform the programming operation. This block may be known as a recovery block. As used herein, a recovery block is a block used by the memory device 134 to write data to after a previous failed write operation. Then, the subsequent program operations may continue to fail because even though peripheral circuit 304-1 may select another block in the block group to write to, because block 302-1 is an open block, and there is still a peripheral defect, block 302-1 remains selected for subsequent programming operations, thus causes another (i.e., back-to-back) programming failure similar to the programming failure shown in FIG. 3B.

This programming failure scenario can continue perpetually until one of the following situations may occur where 1) all spare blocks are exhausted or 2) the system drive may go into read only mode. As a result, only data the host has already written may be accessed, thereby affecting performance of the storage device 120. The host may also time-out because the host is trying to recover data consistently, but unable to get the data back in the time that it was 'expecting' the data.

In some embodiments, the system level solution, as described herein, to counteract the programming failure problem, is to have only one open block in a given block group that shares the same address line, open at a given time. For example, where sixteen (16) blocks correspond to a single block group, if a memory device has nine-hundred ninety (990) blocks on a die, then the memory device can have about 990/16=sixty one (61) block groups. Therefore, at any point, the memory device may have about 61 open blocks corresponding to each of the different block groups (e.g., blocks 302-1 to 302-16, blocks 302-17 to 302-32, or blocks 302-33 to 302-48).

Figure 3C:
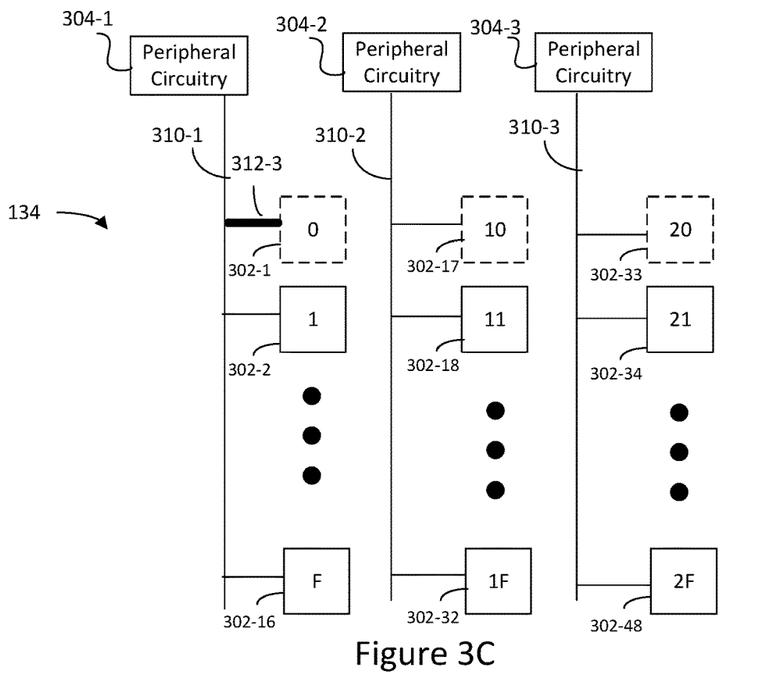
FIGS. 3C-3D is a conceptual block diagram illustrating a sequence for programming one or more blocks of memory device 134 of FIGS. 1-2 that does not result in back-to-back programming errors for the memory device 134.
Figure 3D:
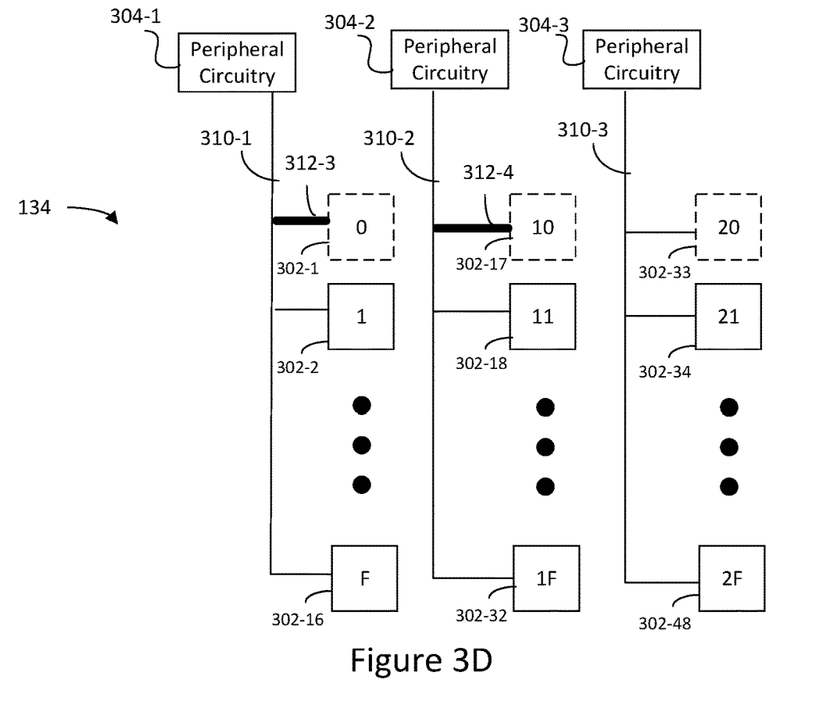

Turning now to FIGS. 3C-3D, there is shown a conceptual block diagram illustrating a process for programming one or more blocks of memory device 134 of FIGS. 1-2 that does not result in back-to-back programming errors for the memory device 134, in accordance with some embodiments.

As shown in FIGS. 3C and 3D, memory device 134 may allocate a single open block to a block group connected to a corresponding address line. For example, block 302-1 labeled as "0" is connected to address line 310-1, block 302-17 labeled as "10" is connected to address line 310-2, and block 302-33 labeled as "20" is connected to address line 310-3.

In some embodiments, memory device 134 may allocate a single open block to each block group by selecting a single open block in each block group as the designated open block for subsequent programming. After at least one or more other open blocks in other block groups are subsequently programmed, memory device 134 may allocate a new open block in a respective block group. In some embodiments, memory device 134 may allocate a new open block in a respective block group as the allocated open block by performing garbage collection on the block group. While performing garbage collection, memory device 134 may reallocate valid data in different blocks of the block group and maintaining a single open block as the open block for subsequent programming.

In response to receiving a first program request, as shown in FIG. 3C which includes similar components to FIG. 3A except for the different open block allocation, a peripheral circuit 304-$i$ may program one of the blocks 302 connected to the respective peripheral circuit 304-1. To program one of the blocks 302 in a block group, a peripheral circuit 304-$i$ transmits an address signal to the respective block 302 via address line 310. For example, as shown in FIG. 3C, peripheral circuit 304-1 transmits an address signal via address line 310-1 that causes block 302-1, labeled as block "0" to be selected for programming. The bolded selection line 312-3 between block 302-1 and address line 310-1 indicates that block 302-1 is being programmed.

In response to receiving a second program request, memory device 134 may determine that the second program request would cause programming of an open block in block group 310-1. Memory device 134 may forego programming of any blocks in block group 310-1 and instead cause a separate peripheral circuit to program a block in a separate block group to avoid a potential back-to-back programming error caused by a periphery defect. For example, as shown in FIG. 3D, peripheral circuit 304-2, rather than peripheral circuit 304-1, transmits an address signal via address line 310-2 that causes block 302-17, labeled as block "10" to be selected for programming. The bolded selection line 312-4 between block 302-17 and address line 310-2 indicates that block 302-17 is being programmed.

Note that although a peripheral defect might exist for the memory device 134 which causes open block 302-1 to remain selected for an amount of time even after the previous programming operation has completed, back-to-back program failures can be avoided. The back-to-back programming failure can be avoided by programming subsequent blocks in different block groups connected to separate address lines, such as in FIG. 3D where blocks 302-1 and 302-17 on different address lines 310-1 and 310-2, respectively, are being simultaneously selected due to the peripheral defect, yet block 302-17 can still be programmed successfully.

In some embodiments, in response to receiving a third program request, memory device 134 may cause a separate peripheral circuit to program a block in a separate block group to avoid a potential back-to-back programming error caused by a periphery defect. In this example, one of peripheral circuits 304-1 or 304-3 may select one of the blocks 302-1 to 302-18 and 302-33 to 302-48 that are not part of the same block group as open block 302-17. As a result, back-to-back programming failure can be avoided by programming subsequent blocks in different block groups that follow after an open block programming event.

Figure 4:
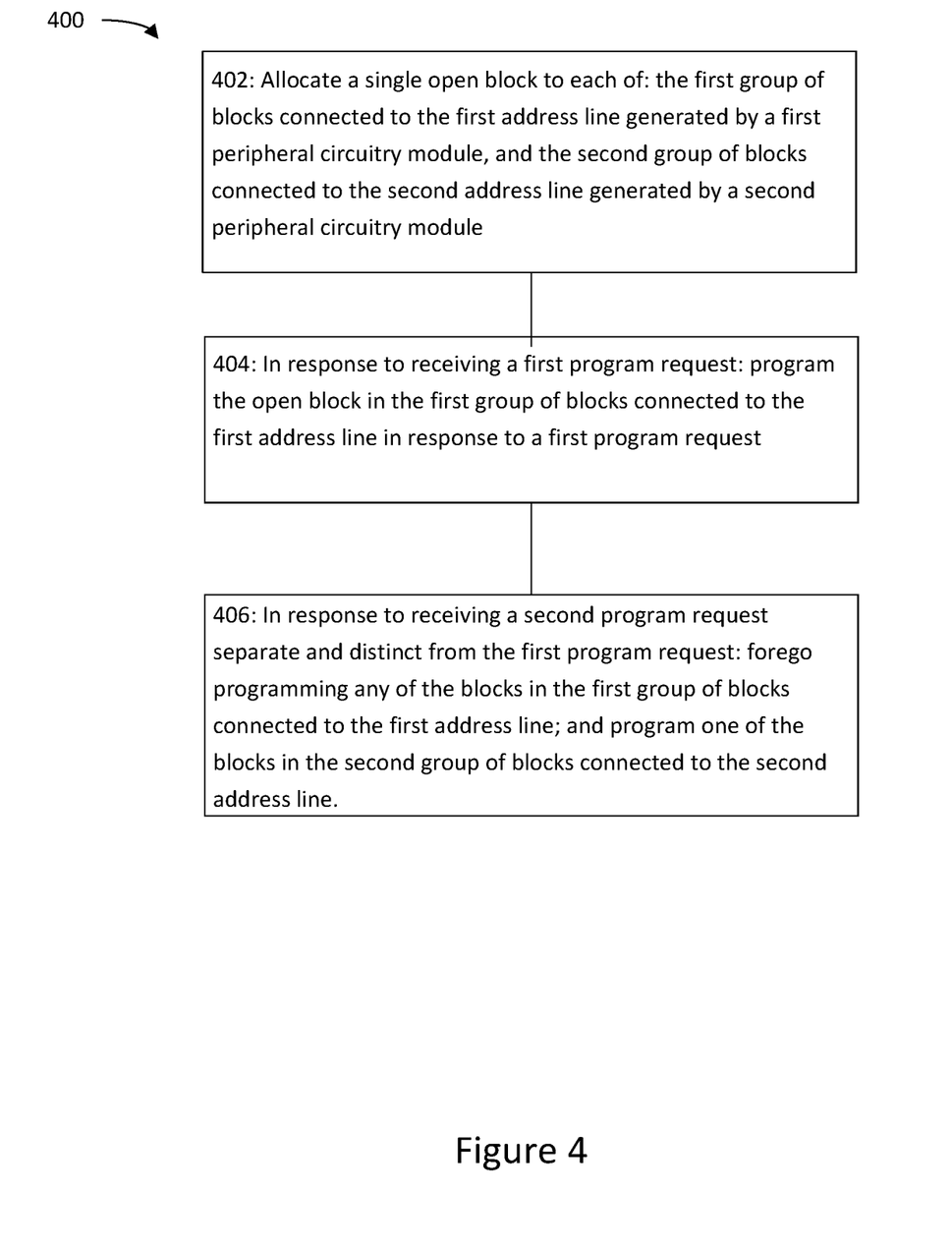
FIG. 4 is an exemplary illustration of a flow chart for avoiding back to back program failure, in accordance with an exemplary embodiment of the present invention.

FIG. 4 illustrates a flow chart representation of a method 400 for avoiding back-to-back programming failures, in accordance with some embodiments. Method 400 is performed in a non-volatile memory storage system (e.g., storage device 120 or memory device 134, FIGS. 1-2). For ease of understanding, and by way of a non-limiting example, the method 400 will be described as being performed by memory device 134. In some embodiments, one or more portions of method 400 are performed by at least one of storage device 120 and memory device 134. The storage system may include peripheral circuitry that causes one or more blocks of a memory cell array to be programmed. An example of the peripheral circuitry may be peripheral circuits 304 as shown in FIGS. 3A-3D. An example of a block may be block 302-1 as shown in FIGS. 3A-3D which is a portion of memory cell array 22 as shown in FIG. 2. The blocks may comprise a block group that are all connected to a single address line. An example of a first block group may be blocks 302-1 to 302-16 as shown in FIGS. 3A-3D. An example of a second block group may be blocks 302-17 to 302-32 as shown in FIGS. 3A-3D. An example of a first address line may be address line 310-1 as shown in FIGS. 3A-3D which is connected to the exemplary first block group. An example of a second address line may be address line 310-2 as shown in FIGS. 3A-3D which is connected to the exemplary second block group.

The memory device 134 may allocate (402) a single open block to the first group of blocks connected to the first address line that transmits a first address signal generated by a first peripheral circuitry module. An example of a first single open block may be block 302-1 as shown in FIG. 3D. In one example, block 302-1 is allocated to a first block group of blocks 302-1 to 302-16. Blocks 302-1 to 302-16 that comprise the first block group may be connected to an address line 310-1, which may correspond to the first address line. Address line 310-1 may transmit an address signal from peripheral circuit 304-1, which may correspond to the first peripheral circuitry module.

The memory device 134 may allocate a single open block to the second group of blocks connected to the second address line that transmits a second address signal generated by a second peripheral circuitry module. An example of a second single open block may be block 302-17 as shown in FIG. 3D. In one example, block 302-17 is allocated to a second block group of blocks 302-17 to 302-32. Blocks 302-17 to 302-32 that comprise the second block group may be connected to an address line 310-2, which may correspond to the second address line. Address line 310-2 may transmit an address signal from peripheral circuit 304-2, which may correspond to the first peripheral circuitry module.

In some embodiments, an open block is configured to be partially programmed such that only a first portion of wordlines are programmed while a second portion of wordlines are not programmed. In some embodiments, programming the open block in the first group of blocks includes writing data to at least some, but not all, of the word lines of the open block. An example of a single open block is block 302-1 as shown in FIG. 3D. In an example, if block 302-1 has ninety-five word lines, twenty-five word lines might be programmed during a single programming operation, leaving the other seventy word lines unprogrammed.

In some embodiments, the first peripheral circuitry module includes at least one of: a first control gate and a first decoder. In some embodiments, the second peripheral circuitry module includes at least one of: a second control gate and a second decoder. In some embodiments, the second control gate and the second decoder are, in some embodiments, separate and distinct from the first control gate and the first decoder, respectively. An example of a control gate may be control circuit 26 in FIG. 2. An example of a decoder may be column decoder 24 and/or row decoder 30 in FIG. 2. Another example of a decoder may be word line control circuit 25 in FIG. 2.

In response to receiving a first program request, the memory device 134 may program (404) the open block in the first group of blocks connected to the first address line. For example, in FIG. 3C, memory device 134 may program block 302-1 which may correspond to the open block in the first group of blocks connected to the first address line. In an example, blocks 302-1 to 302-16 that comprise the first block group may be connected to an address line 310-1, which may correspond to the first address line.

In response to receiving a second program request separate and distinct from the first program request and in response to determining that a program request causes a respective open block to be programmed, the memory device 134 may forego (406) programming any of the blocks in the first group of blocks connected to the first address line. For example, in FIG. 3D, memory device 134 may forego programming block 302-1 which may correspond to the open block in the first group of blocks connected to the first address line, where blocks 302-1 to 302-16 that comprise the first block group may be connected to an address line 310-1, which may correspond to the first address line. In some embodiments, the memory device 134 may instead program one of the blocks in the second group of blocks connected to the second address line. For example, in FIG. 3D, memory device 134 may program block 302-17 which may correspond to the open block in the second group of blocks connected to the second address line, where blocks 302-17 to 302-32 may comprise the second block group that may be connected to an address line 310-2, which may correspond to the second address line. As a result, back-to-back programming failure can be avoided by programming subsequent blocks in different block groups that follow after an open block programming event.

In some embodiments, programming one of the blocks in the second group of blocks includes programming the open block in the second group of blocks.

In some embodiments, the memory device 134 may, after programming the open block in the second group of blocks connected to the second address, in response to receiving a third program request separate and distinct form the first program request and the second program request: forego programming any of the blocks in the second group of blocks connected to the second address line. In some embodiments, the memory device 134 may instead program another block other than the blocks in the second group of blocks connected to the second address line. In one example, one of peripheral circuits 304-1 or 304-3 may select one of the blocks 302-1 to 302-18 and 302-33 to 302-48 that are not part of the same block group as open block 302-17. As a result, back-to-back programming failure can be avoided by programming subsequent blocks in different block groups that follow after an open block programming event.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

We claim:

1. A system comprising:
a first group of blocks connected to a first address line;
a second group of blocks connected to a second address line separate and distinct from the first address line;
a memory device configured to:
allocate a single open block to each of:
the first group of blocks connected to the first address line that transmits a first address signal generated by a first peripheral circuitry module, and
the second group of blocks connected to the second address line that transmits a second address signal generated by a second peripheral circuitry module;
in response to receiving a first program request:
program the open block in the first group of blocks connected to the first address line;
in response to receiving a second program request separate and distinct from the first program request and in response to determining that the second program request causes a respective open block to be programmed:
forego programming any of the blocks in the first group of blocks connected to the first address line; and
program one of the blocks in the second group of blocks connected to the second address line.

2. The system of claim 1, wherein programming one of the blocks in the second group of blocks includes programming the open block in the second group of blocks.

3. The system of claim 2, wherein the memory device is further configured to:
after programming the open block in the second group of blocks connected to the second address:
in response to receiving a third program request separate and distinct form the first program request and the second program request:
forego programming any of the blocks in the second group of blocks connected to the second address line; and
program another block other than the blocks in the second group of blocks connected to the second address line.

4. The system of claim 1, wherein an open block is configured to be partially programmed such that only a first portion of wordlines are programmed while a second portion of wordlines are not programmed.

5. The system of claim 1, wherein the first address line is a control gate line.

6. The system of claim 1, wherein the first peripheral circuitry module includes at least one of: a first control gate and a first decoder,
wherein the second peripheral circuitry module includes at least one of: a second control gate and a second decoder.

7. The system of claim 1, wherein programming the open block in the first group of blocks includes writing data to at least some, but not all, of the word lines of the open block.

8. A method for minimizing back-to-back program failures at a storage system including a first group of blocks connected to a first address line, a second group of blocks connected to a second address line separate and distinct from the first address line, and a memory device configured to perform the steps of:
allocating a single open block to each of:
the first group of blocks connected to the first address line that transmits a first address signal generated by a first peripheral circuitry module, and
the second group of blocks connected to the second address line that transmits a second address signal generated by a second peripheral circuitry module;
in response to receiving a first program request:

programming the open block in the first group of blocks connected to the first address line;

in response to receiving a second program request separate and distinct from the first program request and in response to determining that a program request causes a respective open block to be programmed:

forego programming any of the blocks in the first group of blocks connected to the first address line; and programming one of the blocks in the second group of blocks connected to the second address line.

9. The method of claim 8, wherein programming one of the blocks in the second group of blocks includes programming the open block in the second group of blocks.

10. The method of claim 8, wherein the memory device is further configured to perform the steps of:

after programming the open block in the second group of blocks connected to the second address:

in response to receiving a third program request separate and distinct form the first program request and the second program request:

forego programming any of the blocks in the second group of blocks connected to the second address line; and program another block other than the blocks in the second group of blocks connected to the second address line.

11. The method of claim 8, wherein an open block is configured to be partially programmed such that only a first portion of wordlines are programmed while a second portion of wordlines are not programmed.

12. The method of claim 8, wherein the first address line is a control gate line.

13. The method of claim 8, wherein the first peripheral circuitry module includes at least one of: a first control gate and a first decoder, wherein the second peripheral circuitry module includes at least one of: a second control gate and a second decoder.

14. The method of claim 8, wherein programming the open block in the first group of blocks includes writing data to at least some, but not all, of the word lines of the open block.

15. A storage system including a first group of blocks connected to a first address line, a second group of blocks connected to a second address line separate and distinct from the first address line, and a memory device comprising:

means for allocating a single open block to each of:

the first group of blocks connected to the first address line that transmits a first address signal generated by a first peripheral circuitry module, and the second group of blocks connected to the second address line that transmits a second address signal generated by a second peripheral circuitry module;

in response to receiving a first program request:

means for programming the open block in the first group of blocks connected to the first address line;

in response to receiving a second program request separate and distinct from the first program request and in response to determining that a program request causes a respective open block to be programmed:

means for foregoing programming of any of the blocks in the first group of blocks connected to the first address line; and means for programming one of the blocks in the second group of blocks connected to the second address line.

* * * * *